United States Patent [19]

Park

[11] Patent Number: 5,686,327
[45] Date of Patent: Nov. 11, 1997

[54] METHOD FOR FABRICATING SEMICONDUCTOR DEVICE

[75] Inventor: Jong Sung Park, Choongchungbook-Do, Rep. of Korea

[73] Assignee: LG Semicon Co., Ltd., Cheongju, Rep. of Korea

[21] Appl. No.: 572,958

[22] Filed: Dec. 15, 1995

[30] Foreign Application Priority Data

May 13, 1995 [KR] Rep. of Korea ............... 11830/1995

[51] Int. Cl.⁶ .................................................. H01L 21/265
[52] U.S. Cl. ........................... 437/40 DM; 437/41 DM; 437/44; 437/70; 437/72
[58] Field of Search ..................... 437/44, 40 DM, 437/41 DM, 69, 70, 72, 73

[56] References Cited

U.S. PATENT DOCUMENTS

| | | | |
|---|---|---|---|
| 3,993,513 | 11/1976 | O'Brien | 437/72 |
| 4,366,613 | 1/1983 | Ogura et al. | 437/45 |
| 5,021,355 | 6/1991 | Dhong et al. | 437/44 |
| 5,087,581 | 2/1992 | Rodder | 437/44 |
| 5,089,865 | 2/1992 | Mitsui et al. | 257/384 |
| 5,132,238 | 7/1992 | Murakami et al. | 437/44 |
| 5,177,027 | 1/1993 | Lowrey et al. | 437/44 |
| 5,494,837 | 2/1996 | Subramanian et al. | 437/62 |

FOREIGN PATENT DOCUMENTS 0029552  6/1981  European Pat. Off. ............. 437/72

*Primary Examiner*—Trung Dang
*Attorney, Agent, or Firm*—Fleshner & Kim

[57] ABSTRACT

A method for fabricating a semiconductor device, capable of forming an element-isolating insulating film for MOS transistors in a self-aligned manner during formation of the MOS transistors on a substrate, thereby simplifying the fabrication of the semiconductor device. The substrate is vertically etched to form a protruded portion thereof. By the vertical height of the protruded substrate portion, the gate length of each corresponding MOS transistor can be adjusted. This results in an improvement in the integration degree of the semiconductor device. Accordingly, it is possible to easily apply the least design method to design of highly integrated semiconductor devices.

19 Claims, 3 Drawing Sheets

METHOD FOR FABRICATING SEMICONDUCTOR DEVICE

BACKGROUND OF THE INVENTION

1. Filed of the Invention

The present invention relates to a method for fabricating a semiconductor device, and more particularly to a method for fabricating a semiconductor device including MOS transistors isolated by element-isolating insulating films.

2. Description of the Prior Art

In the fabrication of semiconductor devices which include a plurality of active elements respectively formed on the active regions defined at a substrate, the formation of an oxide film for electrically isolating the active elements from one another is generally carried out prior to the formation of the active elements. Such an element-isolating oxide film is formed on the substrate at a region defined between adjacent active elements using a local oxidation of silicon (LOCOS) method.

FIGS. 1A to 1E illustrate a conventional method for fabricating a semiconductor device having a lightly doped drain (LDD) structure provided with an element-isolating oxide film.

In accordance with the conventional method, over a substrate 1, for example, a single-crystalline silicon substrate formed with p-type wells, an oxide film 2 is deposited to a thickness of 500 Å, as shown in FIG. 1A. A nitride film 3 is then deposited over the oxide film 2 to a thickness of 2,400 Å.

Thereafter, a photoresist film pattern 4 corresponding to active regions defined at the substrate 1 is formed on the nitride film 3 using a photo-etching method. Using the photoresist film pattern 4 as a mask, the nitride film 3 and oxide film 2 are sequentially etched at their portions not covered with the photoresist film pattern 4, thereby exposing an element-isolating region defined at the substrate 1.

Subsequently, n-type impurity ions such as phosphor ions are implanted in the exposed portion of the substrate 1 corresponding to the element-isolating region, with an energy of 50K eV and in a dose of 5 E13 ions/cm$^2$.

After completing the ion implantation, the photoresist film pattern 4 is removed, as shown in FIG. 1B. Using the remaining nitride film 3 and oxide film 2 as a mask, the exposed portion of substrate 1 corresponding to the element-isolating region is annealed in an oxygen atmosphere, thereby growing an element-isolating oxide film 5 thereover. As the n-type impurity ions implanted in the exposed substrate portion are activated during the annealing, a channel stopper 6 is formed in the ion-implanted portion of substrate 1 beneath the element-isolating oxide film 5.

Thereafter, the nitride film 3 and oxide film 2 are completely removed, thereby exposing portions of the substrate 1 respectively corresponding to the active regions.

As shown in FIG. 1C, a gate oxide film 7 is grown over the portions of substrate 1 corresponding to the active regions to a thickness of 100 Å using a thermal oxidation method.

Over the entire surface of the resulting structure, a polysilicon layer 8 is then deposited to a thickness of 2,000 Å using a chemical vapor deposition method. An oxide film 9 is also deposited over the polysilicon layer 9 to a thickness of 1,500 Å.

A photoresist film pattern (not shown) is then formed using the photo-etching method on the oxide film 9 at a region corresponding to a gate which will be formed later. Thereafter, the oxide film 9, polysilicon layer 8 and gate oxide film 7 are sequentially etched at their portions not covered with the photoresist film pattern so that their portions disposed beneath the photoresist film pattern are left. The photoresist film pattern is then removed.

As a result, an LDD region is defined by the substrate region between the oxide film 9 and the element-isolating oxide film 5.

Subsequently, phosphor ions are implanted in portions of the substrate 1 not covered with the remaining oxide film 9, with an energy of 40K eV and in a dose of 2 E13 ions/cm$^2$ to form an LDD structure.

Over the resulting structure shown in FIG. 1C, an oxide film is deposited using the chemical vapor deposition method, as shown in FIG. 1D. The oxide film is then etched back to form side wall spacers 10 at opposite side walls of the remaining oxide film 9, polysilicon layer 8 and gate oxide film 7.

As a result, a region to provide a drain/source region is defined by a substrate portion between each side wall spacer 10 and the element-isolating oxide film 5.

In order to define the drain/source region, arsenic ions are implanted in the substrate portion between each side wall spacer 10 and the element-isolating oxide film 5, with an energy of 40K eV and in a dose of 5 E15 ions/cm$^2$.

Over the resulting structure shown in FIG. 1D, an oxide film 11 is deposited to a relatively large thickness using the chemical vapor deposition method, as shown in FIG. 1E. The resulting structure is then annealed.

By the annealing, the impurity ions implanted to form the LDD structure are activated, thereby forming an n$^-$-type diffusion region 12 in a portion of the substrate 1 disposed beneath each side wall spacer 10. The impurity ions implanted to define the drain/source region are also activated, thereby forming an n$^+$-type diffusion region 13 in a portion of the substrate 1 disposed between each side wall spacer 10 and the element-isolating oxide film 5.

However, the above-mentioned conventional method is problematic in that the overall fabrication becomes complex because the formation of the element-isolating oxide film is carried out prior to the formation of the MOS transistor having the LDD structure, so that they are independent of each other. Due to such independent formations, it is difficult to accurately align the gate with the corresponding portion of the substrate.

SUMMARY OF THE INVENTION

Therefore, an object of the invention is to provide a method for fabricating a semiconductor device capable of carrying out the formation of the element-isolating oxide film during the formation of the MOS transistor, thereby simplifying the formation of the element-isolating oxide film and, thus, simplifying the fabrication of the semiconductor device.

Another object of the invention is to provide a method for fabricating a semiconductor device, capable of easily applying the least designing method to design of the semiconductor device by adjusting the gate length of MOS transistors by the vertical etch depth of the substrate.

In accordance with the present invention, this object can be accomplished by providing a method for fabricating a semiconductor device, comprising the steps of: forming, on a substrate, a diffusion layer and a first insulating film both having a desired pattern; etching the substrate to a desired depth except for its portion corresponding to the diffusion layer, thereby forming protruded portions of the substrate; forming side wall spacers, comprised of a second insulating film, on respective side walls of the first insulating film, the diffusion layer and the protruded portions of the substrate such that each of the side wall spacers has a height corresponding to the total thickness of the first insulating film, the diffusion layer and each protruded portion of the substrate; and forming an element-isolating film on the substrate at a region defined between facing ones of the side wall spacers.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 2A to 2F illustrate a method for fabricating a semiconductor device in accordance with the present invention.

Figure 1A:
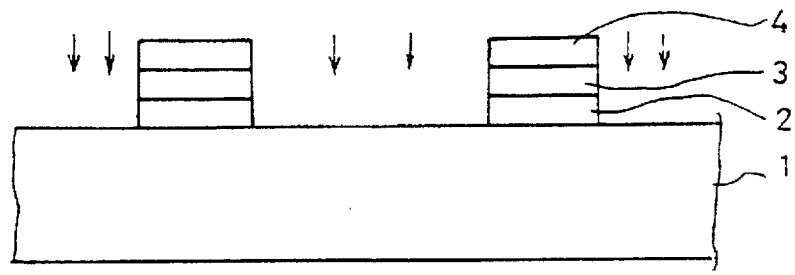
FIGS. 1A to 1E are sectional views respectively illustrating a conventional method for fabricating a semiconductor device.
Figure 1B:
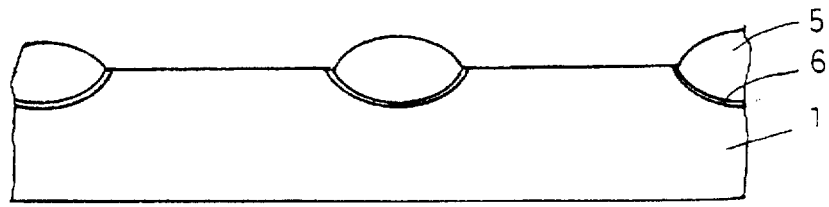
Figure 1C:
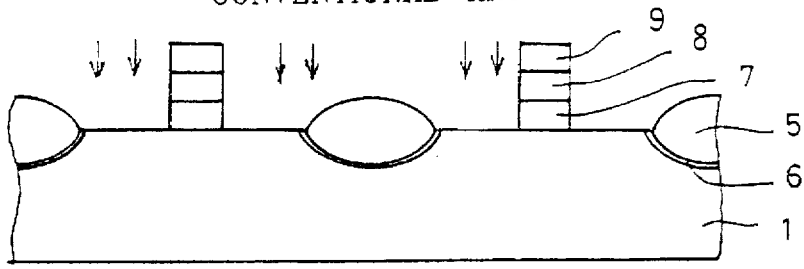
Figure 1D:
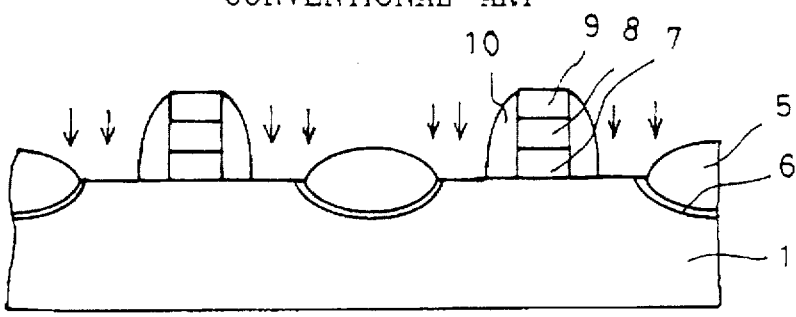
Figure 1E:
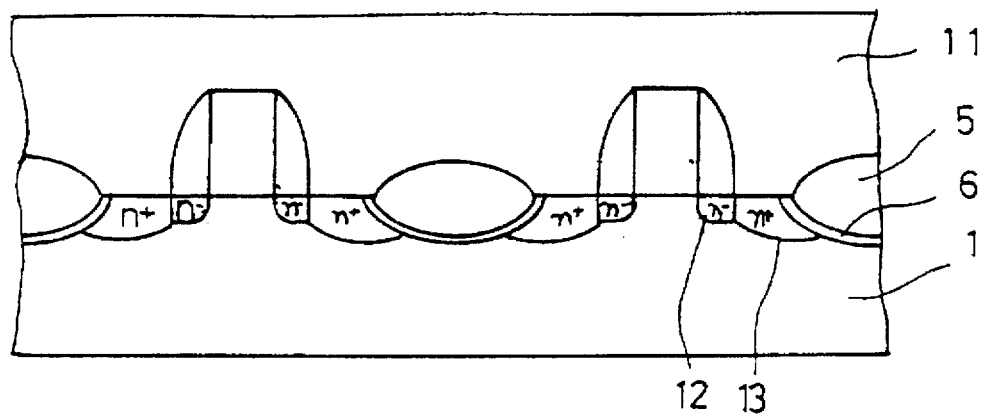
Figure 2A:
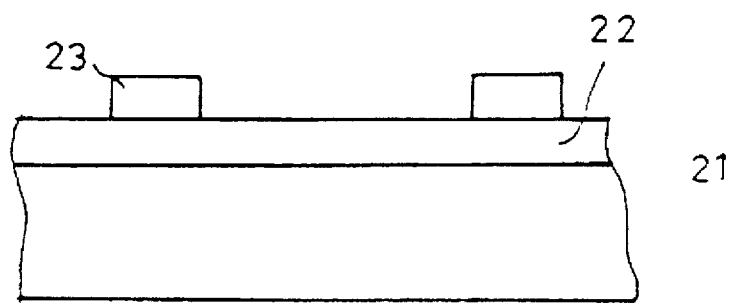
FIGS. 2A to 2F are sectional views respectively illustrating a method for fabricating a semiconductor device in accordance with the present invention.

In accordance with the method of the present invention, a substrate 21, for example, a single-crystalline silicon substrate of a first conduction type, is prepared and then a diffusion layer 22 of a second conduction type opposite to the first conduction type is formed over the substrate 21 as shown in FIG. 2A.

The formation of the diffusion layer 22 is achieved by epitaxially growing a single-crystalline silicon layer over the entire upper surface of the substrate 21 to a desired thickness, for example, 3,000 Å, and implanting impurity ions of the second conduction type, in a high concentration, in the single-crystalline silicon layer.

Where the second-conduction-type ions are n-type impurity ions, for example, arsenic ions, the implantation of the arsenic ions is achieved using an energy of 40K eV and a dose amount of about 5 E15 ions/cm$^2$. On the other hand, the second-conduction-type ions are p-type impurity ions, for example, $BF_2$ ions, the implantation of the $BF_2$ ions is achieved using an energy of 40K eV and a dose of about 4 E15 ions/cm$^2$.

For simplifying the description of the present invention, the following description will be made in conjunction with the case wherein the first conduction type and the second conduction type are the p-type and the n-type, respectively.

An insulating film 23 is then deposited over the diffusion layer 22 to a thickness of 0.3 Å using the chemical vapor deposition method. The insulating film 23 is comprised of an oxide film or a nitride film.

Thereafter, a photoresist film pattern (not shown) is formed on the insulating film 23 using the photo-etching method. Using the photoresist film pattern as a mask, the insulating film 23 is then removed at its portion not masked with the photoresist film pattern, so that only its portion disposed beneath the photoresist film pattern remains.

Figure 2B:
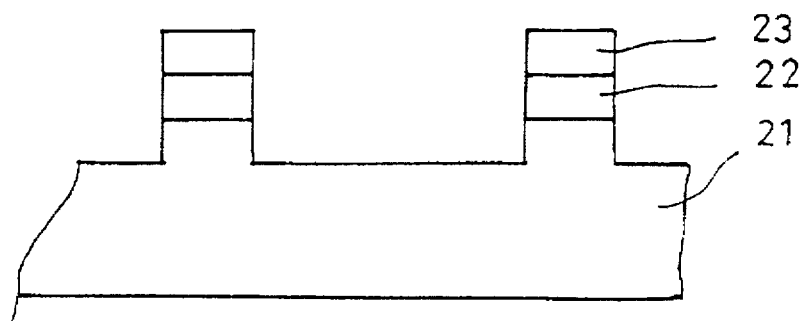

As shown in FIG. 2B, the diffusion layer 22 is selectively removed at its portion not masked with the remaining insulating film 23, using a dry etch method utilizing an anisotropic etch characteristic, for example, a reactive ion etch method. As a result, the diffusion layer 22 remains only at its portion corresponding to a drain to be formed beneath the insulating film 23. Subsequently, the portion of substrate 21 exposed after the removal of the diffusion layer 22 is removed to a desired depth so as to determine the length of the gate which will be formed later.

Figure 2C:
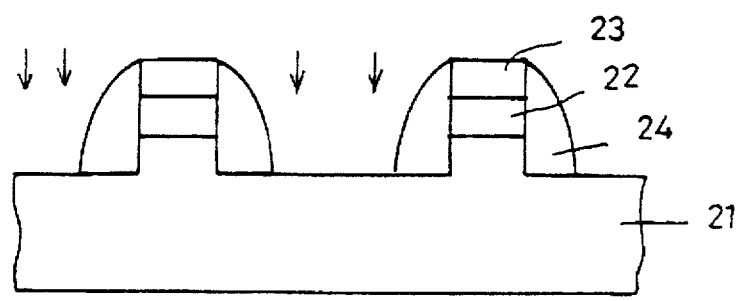

Over the entire upper surface of the resulting structure shown in FIG. 2B, another insulating film such as nitride film is deposited as shown in FIG. 2C. The insulating film is then etched back, thereby forming a first side wall spacers 24 comprised of the insulating film.

As a result, an element-isolating region is defined by a portion of the substrate 21 between facing the first side wall spacers 24.

In order to form channel stoppers, p-type impurity ions such as $BF_2$ are implanted in portions of the substrate 21 respectively corresponding to element-isolating regions defined by the first side wall spacers 24. The implantation of $BF_2$ is carried out in a self-aligned manner and using an energy of 80K eV and a dose of 5 E13 ions/cm$^2$.

Figure 2D:
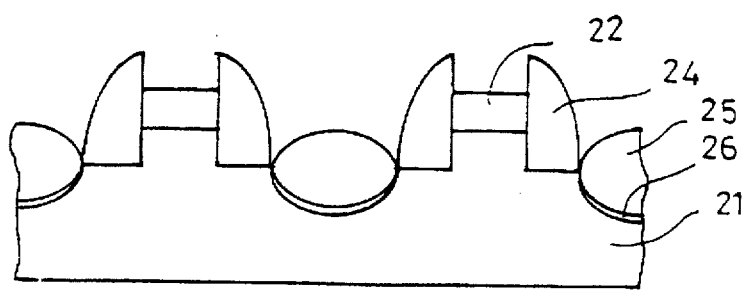

Thereafter, the remaining insulating film 23 is completely removed, as shown in FIG. 2D. The resulting structure is then annealed in an oxygen atmosphere.

By the annealing, an element-isolating insulating film 25 is formed over each portion of the substrate 21 corresponding to each element-isolating region. At this time, the impurity ions implanted to form the channel stopper is activated, thereby forming a channel stopper 26 in a substrate portion disposed beneath the element-isolating insulating film 25.

At the same time, an oxide film (not shown) is formed over the diffusion layer 22.

Figure 2E:
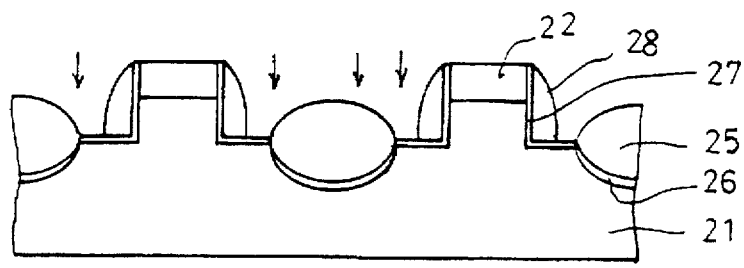

The side wall spacers 24 are then removed to expose the upper surface portion of the substrate 21 corresponding to the region defined between the diffusion layer 22 and the element-isolating film 25 and the upper surface of the diffusion layer 22, as shown in FIG. 2E. Thereafter, any oxide film which could have been possibly left on the exposed surfaces of the substrate 21 and diffusion layer 22 is completely removed.

If desired, n-type impurity ions may be implanted, in a low concentration, in the portion of the substrate 21 defined between the remaining diffusion layer 22 and the element-isolating insulating film 25, to form an LDD structure.

A gate insulating film 27 comprised of, for example, a gate oxide film is then formed to a thickness of 80 to 120 Å on the surface portion of the substrate 21 defined between the diffusion layer 22 and the element-isolating insulating film 25 and on the surface of the diffusion layer 22.

Over the resulting structure, a polysilicon layer is deposited to a thickness of 2,000 Å using the chemical vapor deposition method. The polysilicon layer is then etched back to form a second side wall spacers comprised of the polysilicon layer and thereby forming gates 28 comprised of the polysilicon layer. At this time, the substrate 21 is exposed at its portions respectively corresponding to drain/source regions.

In other words, each portion of substrate 21 corresponding to each drain/source region is defined between each gate 28 and the element-isolating insulating film 25.

Meanwhile, the gate insulating film 27 is damaged at its portions in contact with the diffusion layer 22 during the etch-back step for the gate 28.

Subsequently, n-type impurity ions, namely, arsenic ions are implanted in the exposed portions of the substrate 21 in a self-aligned manner, using an energy of 40K eV and a dose of 5 E15 ions/cm², to form drain/source regions in the exposed substrate portions.

Figure 2F:
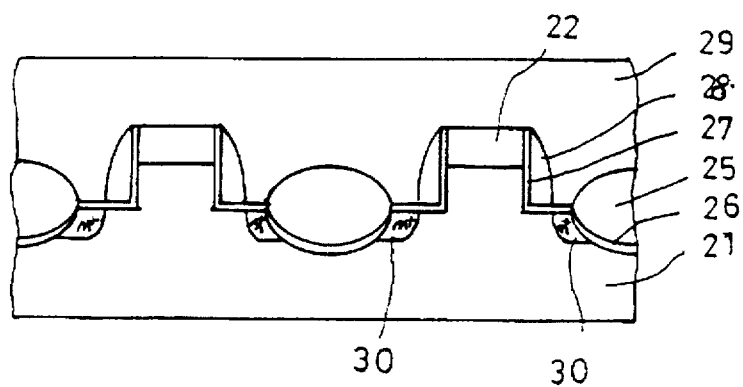

Over the entire upper surface of the resulting structure shown in FIG. 2E, an insulating film 29 is then deposited, as shown in FIG. 2F. The resulting structure is then annealed to activate the impurity ions implanted for forming source regions.

As a result, an n⁺-type diffusion region 30 corresponding to each source region is formed in the substrate 21 between each gate 28 and the element-isolating insulating film 25.

Also, an n⁻-type diffusion region (not shown) corresponding to each LDD may be formed in a portion of the substrate 21 disposed beneath each gate 28.

As apparent from the above description, the present invention provides a method for fabricating a semiconductor device having a common-drain-type MOS transistor structure in which current flows from a source region to a drain region, capable of forming an element-isolating insulating film for MOS transistors in a self-aligned manner during formation of the MOS transistors on a substrate. Accordingly, it is possible to simplify the fabrication of the semiconductor device. In accordance with the present invention, the substrate is vertically etched to form a protruded portion thereof. By the vertical height of the protruded substrate portion, the gate length of each corresponding MOS transistor can be adjusted. This results in an improvement in the integration degree of the semiconductor device. Accordingly, it is possible to easily apply the least design method to design of highly integrated semiconductor devices.

Although the preferred embodiments of illustrative purposes, t disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, comprising the steps of:

forming a first insulating film on a region of a substrate having a diffusion layer;

etching the substrate using the first insulating film as a mask, so as to form a protruded portion of the substrate;

forming a second insulating film on respective side walls of the first insulating film and the protruded portion of the substrate so as to form first side wall spacers;

forming an element-isolating film on a region of the substrate defined between facing ones of the first side wall spacers;

removing the first and the second insulating films, consecutively, so as to expose an underlying portion of the substrate and the protruded portion of the substrate;

forming a gate insulating film on the exposed underlying portion of the substrate and the protruded portion of the substrate;

forming a conduction layer on the gate insulating film so as to form second side wall spacers; and forming diffusion regions in the substrate at regions self-aligned with the second side wall spacers of the conduction layer.

2. A method for fabricating a semiconductor device, comprising the steps of:

forming, on a substrate, a diffusion layer and a first insulating film both having a desired pattern;

etching the substrate to a desired depth except for its portion corresponding to the diffusion layer, thereby forming protruded portions of the substrate;

forming side wall spacers, comprised of a second insulating film, on respective side walls of the first insulating film, the diffusion layer and the protruded portions of the substrate such that each of the side wall spacers has a height corresponding to the total thickness of the first insulating film, the diffusion layer and each protruded portion of the substrate;

forming an element-isolating film on the substrate at a region defined between facing ones of the side wall spacers;

removing the side wall spacers comprised of the second insulating film to expose corresponding surface portions of the substrate and the diffusion layer, and then forming a gate insulating film on the expose surface portions of the substrate and the diffusion layer;

forming side wall spacers, comprised of a conduction layer, on the gate insulating film, as gates; and forming diffusion region in the substrate at region self-aligned with the side wall spacers of the conduction layer.

3. The method in accordance with claim 1, wherein the diffusion layer corresponds to a drain region of a MOS transistor.

4. The method in accordance with claim 1, wherein the diffusion layer is comprised of a single-crystalline silicon layer epitaxially grown over the substrate.

5. The method in accordance with claim 1, wherein the height of the protruded portion of the substrate determines a length of a gate region.

6. The method in accordance with claim 1, wherein the element-isolating insulating film is formed in a self-aligned manner.

7. The method in accordance with claim 6, wherein the element-isolating insulating film is self-aligned with the first side wall spacers of the second insulating film.

8. The method in accordance with claim 2, wherein the conduction layer is comprised of a polysilicon layer.

9. The method in accordance with claim 2, wherein the diffusion regions are source regions.

10. The method in accordance with claim 1, wherein the conduction layer is comprised of a polysilicon.

11. The method in accordance with claim 1, wherein the diffusion regions are source regions.

12. A method for fabricating a semiconductor device, comprising the steps:

forming a first insulating film on a region of a substrate having a diffusion layer;

etching the substrate to a desired depth, using the first insulating film as a mask, so as to form a protruded portion of the substrate;

forming a second insulating film on respective side walls of the first insulating film and the protruded portion of the substrate, thereby forming first side wall spacers;

implating impurity ions in the substrate, using the first side wall spacers as a mask, so as to form a channel stop layer; and forming an element-isolating insulating film on the substrate at a region defined between facing ones of the first side wall spacers, wherein the protruded portion of the substrate determine a length of a gate region.

13. The method according to claim 12, further comprising the steps:

removing the first and the second insulating films, consecutively, so as to expose an underlying portion of the substrate and the protruded portion of the substrate;

forming a gate insulating film on the exposed underlying portion of the substrate and the protruded portion of the substrate;

forming a conduction layer on the gate insulating film so as to form second side wall spacers; and forming diffusion regions in the substrate at regions self-aligned with the second side wall spacers of the conduction layer.

14. The method in accordance with claim 12, wherein the diffusion layer corresponds to a drain region of a MOS transistor.

15. The method in accordance with claim 12, wherein the diffusion layer is comprised of a single-crystalline silicon layer epitaxially grown over the substrate.

16. The method in accordance with claim 12, wherein the element-isolating insulating film is formed in a self-aligned manner.

17. The method in accordance with claim 16, wherein the element-isolating insulating film is self-aligned with the first side wall spacers of the second insulating film.

18. The method in accordance with claim 13, wherein the conduction layer is comprised of polysilicon.

19. The method in accordance with claim 13, wherein the diffusion regions are source regions.

* * * * *